United States Patent
Yao et al.

(10) Patent No.: US 6,986,973 B2
(45) Date of Patent: Jan. 17, 2006

(54) TEST PHOTOMASK, FLARE EVALUATION METHOD, AND FLARE COMPENSATION METHOD

(75) Inventors: Teruyoshi Yao, Kawasaki (JP); Isamu Hanyu, Kawasaki (JP); Katsuyoshi Kirikoshi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/400,399

(22) Filed: Mar. 28, 2003

(65) Prior Publication Data

US 2004/0023130 A1 Feb. 5, 2004

(30) Foreign Application Priority Data

Jul. 31, 2002 (JP) .............................. 2002-223966

(51) Int. Cl.
*G03F 9/00* (2006.01)
(52) U.S. Cl. .............................. 430/5; 430/22; 430/30; 382/144; 382/145; 382/149; 382/151
(58) Field of Classification Search .................... 430/5, 430/22, 30; 382/144, 145, 149, 151
See application file for complete search history.

(56) References Cited

U.S. PATENT DOCUMENTS 6,233,056 B1 * 5/2001 Naulleau et al. ............ 356/520
2003/0068565 A1 * 4/2003 Ki et al. ........................ 430/5
2004/0021854 A1 * 2/2004 Hikima ...................... 356/229
2004/0196447 A1 * 10/2004 Watanabe .................... 355/77

FOREIGN PATENT DOCUMENTS

JP 2001-124663 A 5/2001
JP 2001-272766 A 10/2001

OTHER PUBLICATIONS

Patent Abstracts of Japan, Publication No. 2001272766 A, dated Oct. 5, 2001.
Bourov A., et al., "Impact of Flare on CD Variation for 248nm and 193nm Lithography Systems," Proceedings of SPIE vol. 4346, Sep. 2001, pp. 1388-1393, XP-002322054.
La Fontaine, B., et al., "Analysis of Flare and its Impact on Low-$k_1$ KrF and ArF Lithography," Proceedings of SPIE vol. 4691, Jul. 2002, pp. 44-56, XP-002322033.

* cited by examiner

*Primary Examiner*—Christopher G. Young
(74) *Attorney, Agent, or Firm*—Westerman, Hattori, Daniels & Adrian, LLP

(57) ABSTRACT

Through use of a line pattern which becomes a pattern under measurement and a zone pattern in a zonal shape which becomes a flare causing pattern forming a light transmission region which surrounds the line pattern and causes local flare to occur on the line pattern, the effect of the local flare due to the zone pattern on the line pattern is measured as a line width of the line pattern for evaluation. Further, this measurement value is used to compensate the effect of the local flare on each real pattern.

25 Claims, 22 Drawing Sheets

TEST PATTERN A

TEST PATTERN B

TEST PATTERN C

⋮

TEST PATTERN D

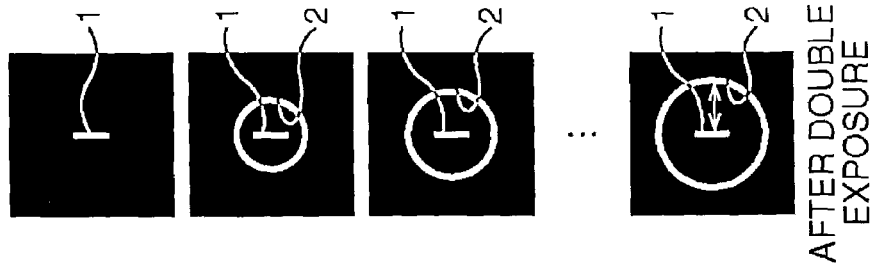
FIG. 7D AFTER DOUBLE EXPOSURE
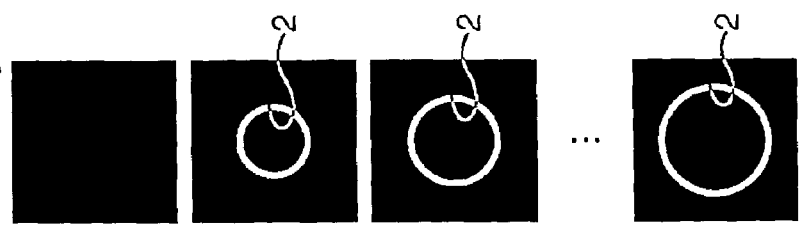
FIG. 7C
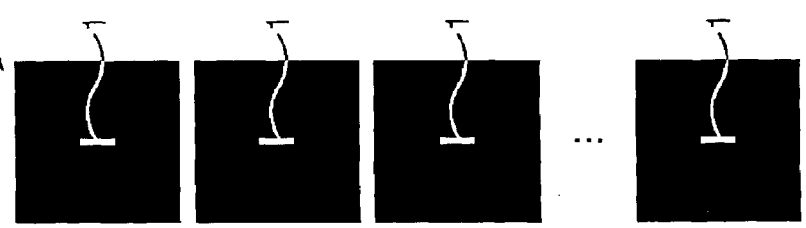
FIG. 7B
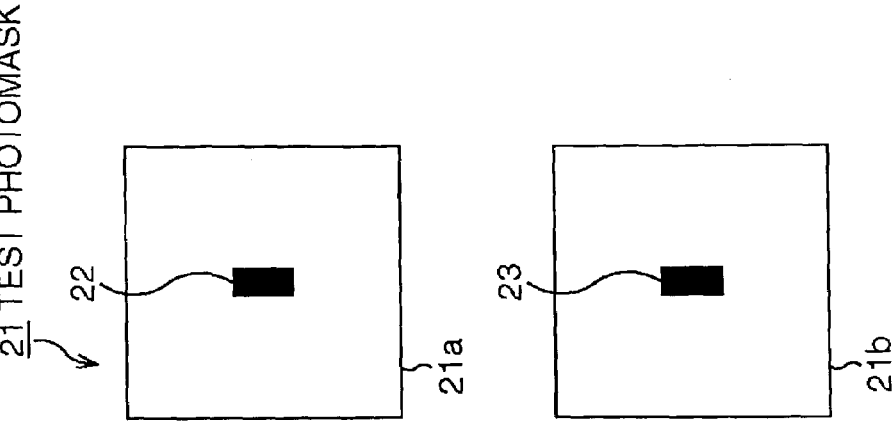
FIG. 7A

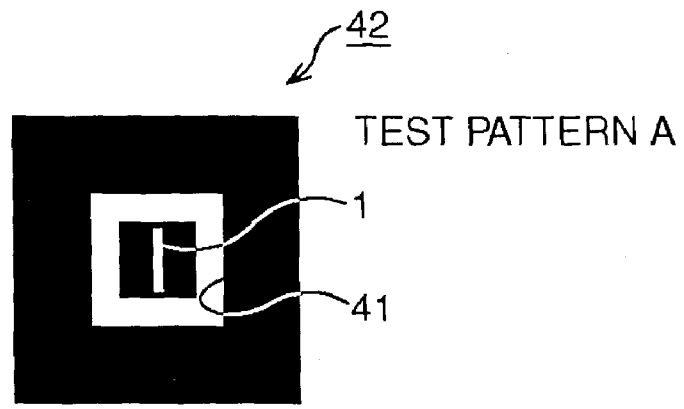
FIG. 10A  TEST PATTERN A
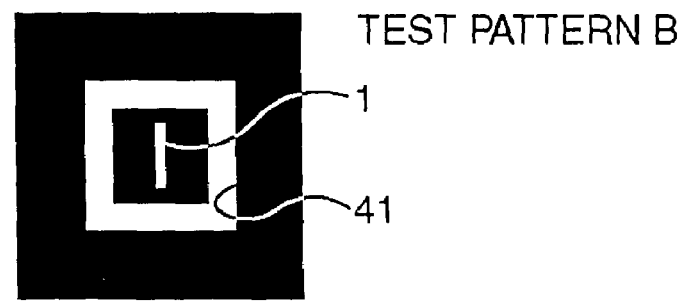
FIG. 10B  TEST PATTERN B
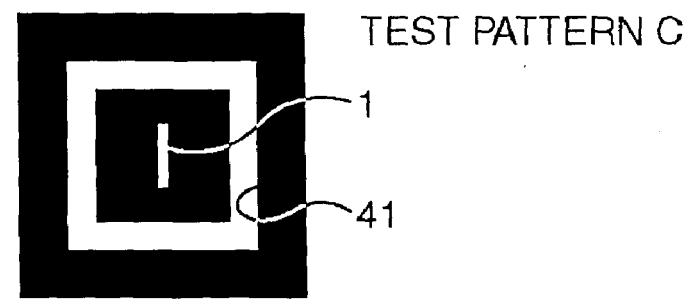
FIG. 10C  TEST PATTERN C
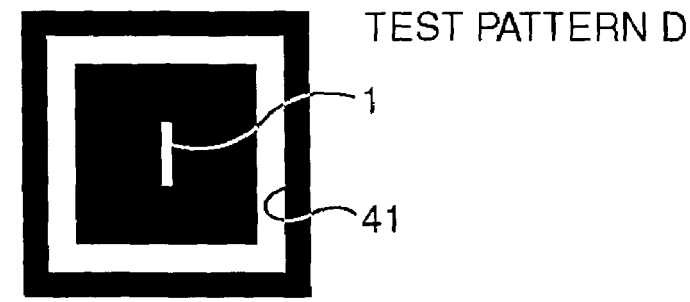
FIG. 10D  TEST PATTERN D

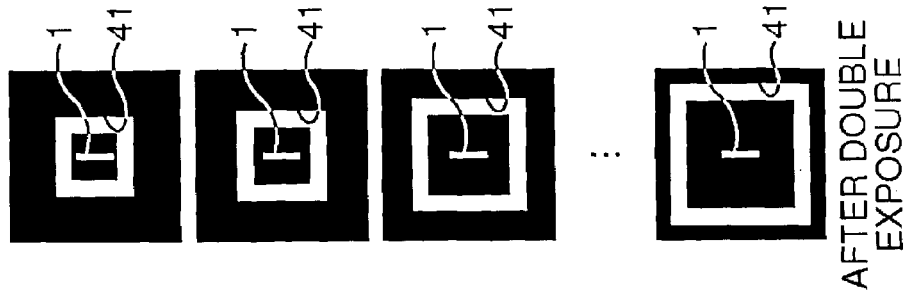
FIG. 11D AFTER DOUBLE EXPOSURE
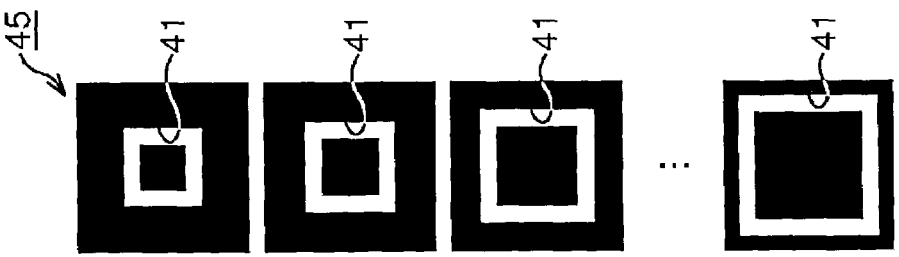
FIG. 11C
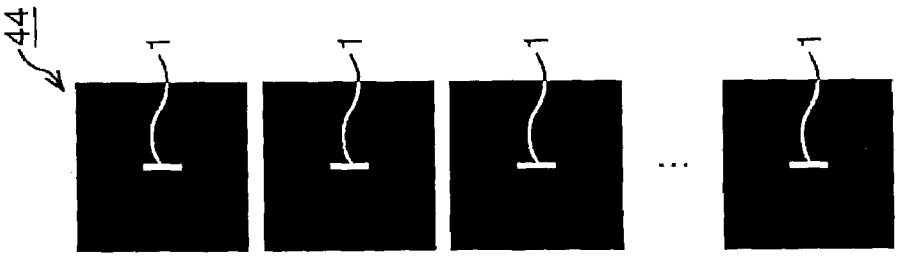
FIG. 11B
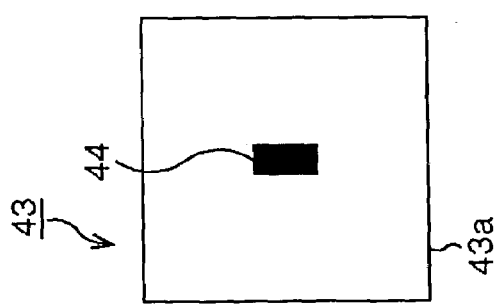
FIG. 11A

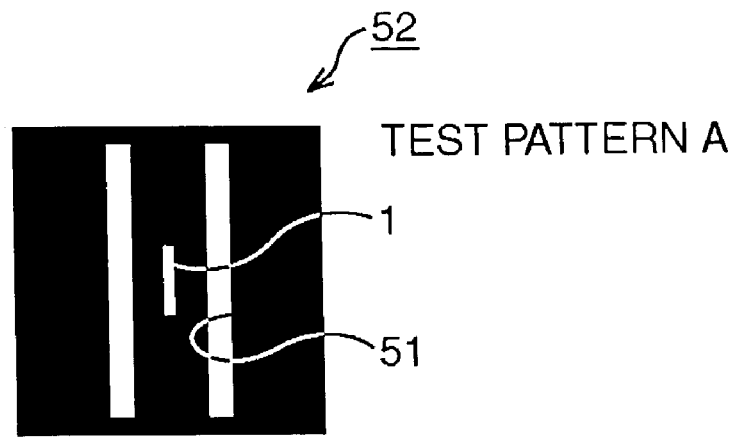
FIG. 14A  TEST PATTERN A
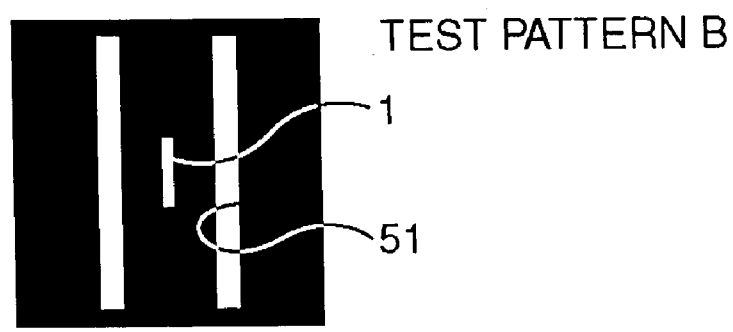
FIG. 14B  TEST PATTERN B
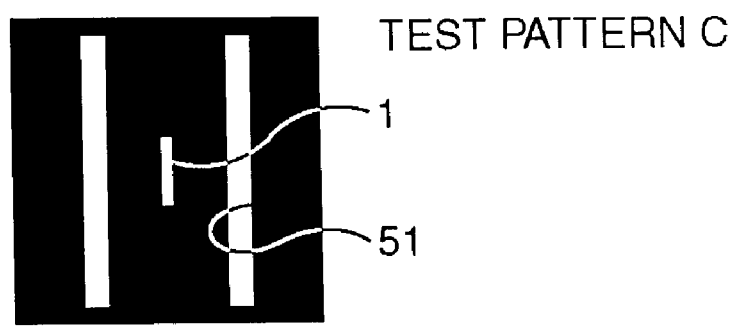
FIG. 14C  TEST PATTERN C
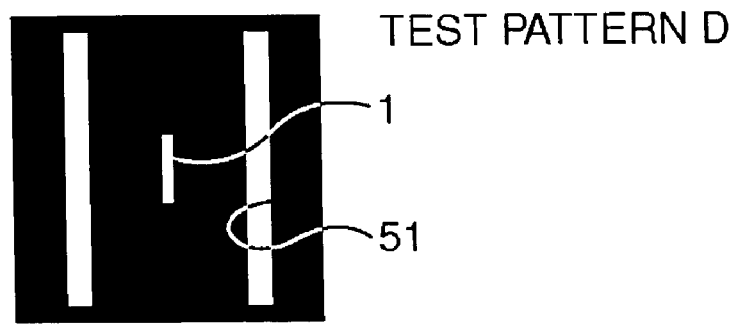
FIG. 14D  TEST PATTERN D

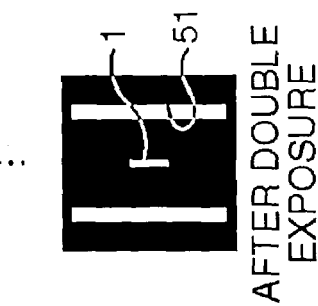
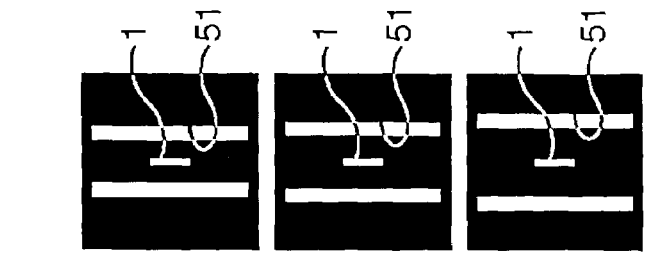
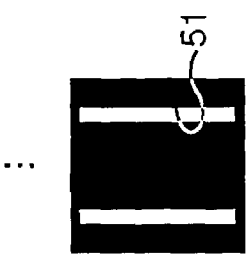
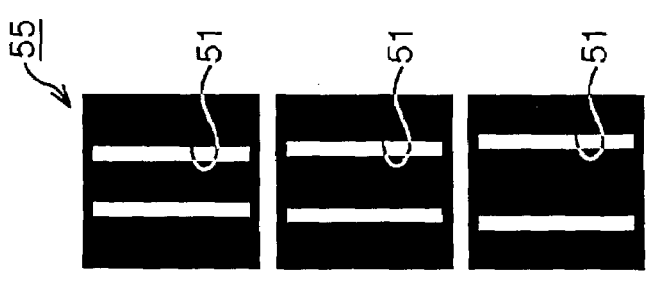
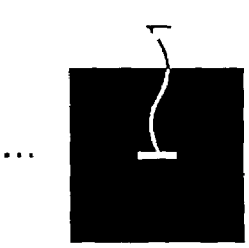
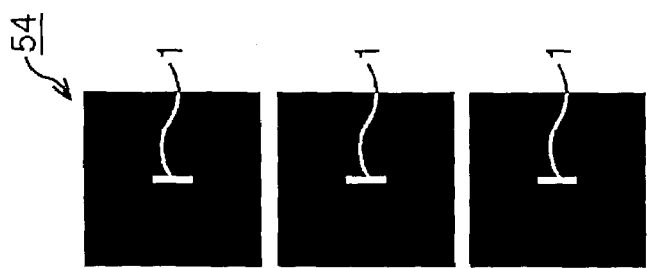
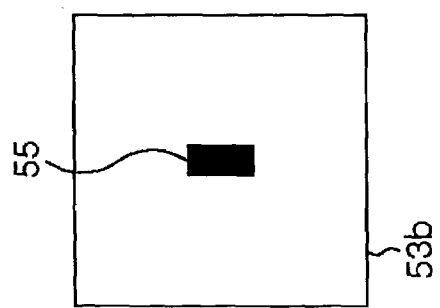
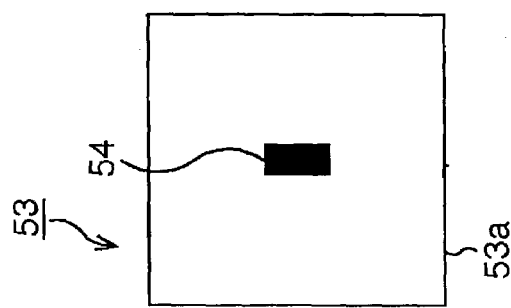

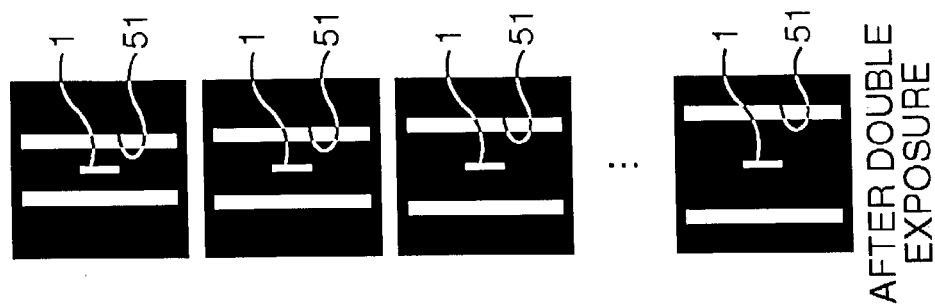
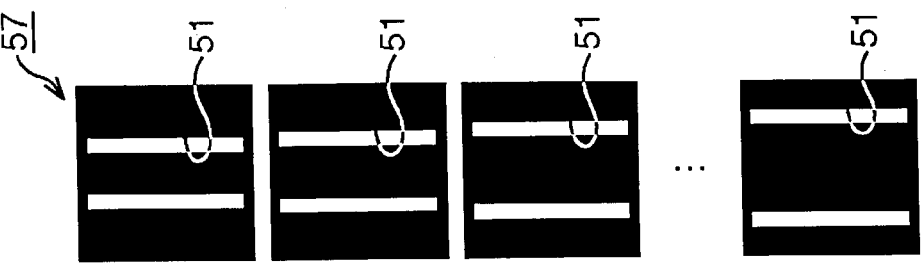
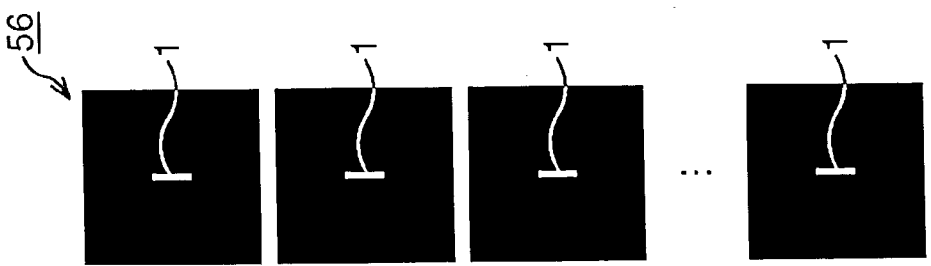
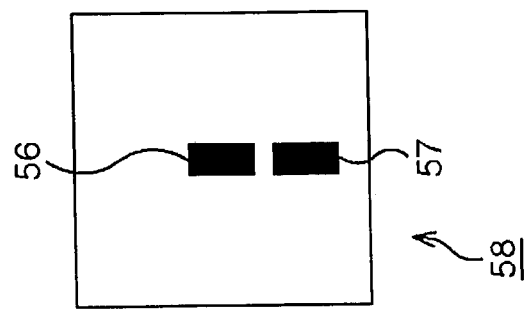

TEST PHOTOMASK, FLARE EVALUATION METHOD, AND FLARE COMPENSATION METHOD

CROSS-REFERENCE TO RELATED APPLICATIONS

This application is based upon and claims the benefit of priority from the prior Japanese Patent Application No. 2002-223966, filed on Jul. 31, 2002, the entire contents of which are incorporated herein by reference.

BACKGROUND OF THE INVENTION

1. Field of the Invention

The present invention relates to a flare evaluation method, a flare compensation method, and a test photomask for an aligner used in a lithography process that is one of manufacturing processes of a semiconductor device.

2. Description of the Related Art

In recent years, a projecting aligner of a dioptric system or catadioptric system is used when forming patterns in a semiconductor element, in which light in an optical path different from the designed one is generated because of reflection and scattering on the surface and inside of a lens of an illumination optical system, a mask, a projection lens, and so on and unevenness in refractive index of lens materials and so on. This is a phenomenon called flare.

Lately, there has been a growing demand for microfabrication and high integration of a semiconductor device, and along with this, exposure light employed in the projecting aligner has been decreased in wavelength. Specifically, exposure light having a wavelength of 193 nm is employed. However, flare, which locally occurs depending on an exposure pattern due to a lens material associated with such a short wavelength, comes to be seen as a problem. This is so-called local flare that becomes a main cause of unintended change in the shape and the line width of a pattern to be transferred.

The above-described local flare needs to be quantified and removed in order to satisfactorily form each intended pattern in a semiconductor device. The local flare, however, is a problem that has recently been focused on as described above, and thus, in the present circumstances, no preferable technique has been supposed yet for intentionally solving the problem giving an attention to the local flare.

SUMMARY OF THE INVENTION

The present invention is developed to solve the above-described problem and it is an object thereof to provide a test photomask for quantitatively estimating the effect of local flare on a pattern which is exposed in lithography, and a flare evaluation method using the same.

Further, it is another object of the present invention to provide a flare compensation method for compensating local flare occurring on real patterns in a semiconductor device, using measurement values estimated by the flare evaluating apparatus to form an intended pattern easily and accurately.

The present inventor attained to aspects of the invention shown below as a result of earnest studies.

The present invention relates to a flare evaluation method for measuring flare in an aligner which is used when a semiconductor device is manufactured.

A flare evaluation method of the present invention, including the step of, through use of a test mask unit having a pattern under measurement which becomes an object of estimating the flare thereon, and a plurality of flare causing patterns forming light transmission regions for causing local flare to occur on the pattern under measurement and having different distances from the pattern under measurement, quantifying an effect of the flare on the pattern under measurement for each of the flare causing patterns as each measurement value of the pattern under measurement, based on a relation thereof to the distance.

A flare compensation method of the present invention, including: a first step of the flare evaluation method; a second step of quantifying a change in the measurement value of the pattern under measurement, based on a relation between the distance and an opening area of the light transmission region of the flare causing pattern; a third step of calculating, in a target real pattern, an area of an opening within a fixed distance from the real pattern for every fixed region; a fourth step of inputting a distance from the real pattern to the opening and the calculated opening area into the relation to calculate the measurement value of the real pattern; and a fifth step of correcting design data of the real pattern based on the calculated measurement value.

Further, the present invention relates to a test photomask for use in measuring flare in an aligner which is used when a semiconductor device is manufactured.

This test photomask includes: a pattern under measurement which becomes an object of estimating the flare thereon; and a plurality of flare causing patterns forming light transmission regions for causing local flare to occur on the pattern under measurement and having different distances from the pattern under measurement.

BRIEF DESCRIPTION OF THE DRAWINGS

FIGS. 7A to 7D are schematic diagrams showing the general configuration of a test photomask which is a component of a flare evaluating apparatus according to a modified example 1 of the first embodiment;

FIGS. 10A to 10D are schematic diagrams showing another general configuration of the test patterns of the test photomask which is a component of the flare evaluating apparatus according to the modified example 3 of the first embodiment;

FIGS. 11A to 11D are schematic diagrams showing another general configuration of the test patterns of the test photomask which is a component of the flare evaluating apparatus according to the modified example 3 of the first embodiment;

FIGS. 14A to 14D are schematic diagrams showing another general configuration of the test patterns of the test photomask which is a component of the flare evaluating apparatus according to the modified example 4 of the first embodiment;

FIGS. 15A to 15D are schematic diagrams showing another general configuration of the test patterns of the test photomask which is a component of the flare evaluating apparatus according to the modified example 4 of the first embodiment;

FIGS. 16A to 16D are schematic diagrams showing another general configuration of the test patterns of the test photomask which is a component of the flare evaluating apparatus according to the modified example 4 of the first embodiment;

DETAILED DESCRIPTION OF THE PREFERRED EMBODIMENTS

-Essential Features of Present Invention-

Essential features of the present invention will be described first.

The present inventor obtained information that the effect of local flare on a pattern varies depending on the distance from the pattern to a transmission region of exposure light existing in the vicinity of the pattern, and hit upon the idea of using a test pattern which becomes an object under estimation of the effect of local flare thereon and a flare causing pattern provided around the test pattern and for intentionally causing local flare to occur on the test pattern so as to quantitatively grasp local flare.

Figure 1:
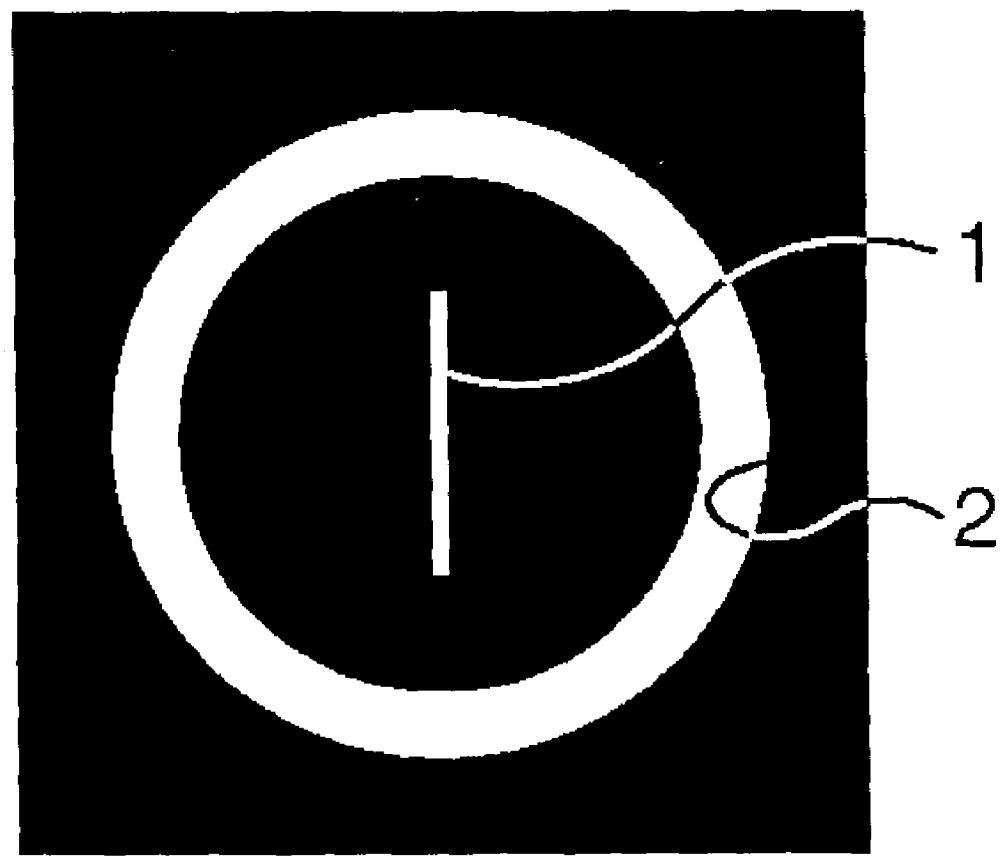
FIG. 1 is a principle diagram showing an example of a test pattern in a flare evaluating apparatus of the present invention.
Figure 2A:
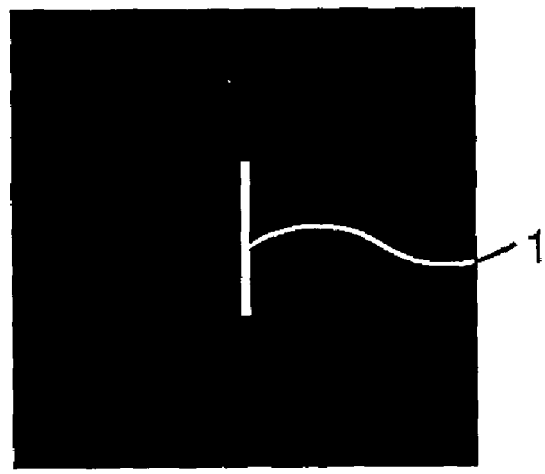
FIGS. 2A and 2B are principle diagrams showing an example of a test pattern in the flare evaluating apparatus of the present invention.
Figure 2B:
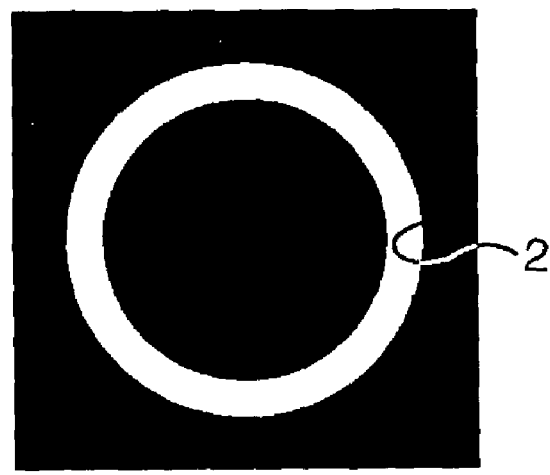

Specifically, the present invention uses, as shown in FIG. 1, a line pattern 1 which becomes a pattern under measurement, and a zone pattern 2 in a zonal shape which becomes a flare causing pattern forming a light transmission region which surrounds the line pattern 1 and causes local flare to occur on the line pattern 1. In the drawing, a black portion indicates a region which blocks off exposure light, and a white portion indicates a region which transmits the exposure light, respectively. In this case, for example, only the line pattern 1 is exposed as shown in FIG. 2A, and a plurality of zone patterns 2, which are composed of light transmission regions and different in diameter, as shown in FIG. 2B (one zone pattern 2 in the illustrated example) are prepared so that the line pattern 1 and each of the zone patterns 2 are multi-exposed. Then, each measurement result thereof, for example, the line width of the line pattern 1, is compared with the line width when only the line pattern 1 is exposed, so that the effect of local flare is grasped as the change in the line width for quantification.

In the point of view, Japanese Patent Laid-Open No. 2001-272766 discloses an invention in which a pattern under measurement is provided in an opening and the relation between the distance from the pattern under measurement to the edge of the opening and the coverage of a light block portion in the opening is measured to evaluate the effect of stray light in an aligner. This invention, however, has an objective to evaluate the effect not of local flare but of the stray light and thus employs the configuration and method suitable for the same. For accurate quantification of the effect of local flare, it is required to grasp the effect not of an opening where a pattern under measurement is provided but of an opening existing in the vicinity of the pattern under measurement. Thus, it is required to grasp the relation between the pattern under measurement and the aforesaid opening (corresponding to a flare causing pattern) with the distance therebetween as a parameter as in the present invention.

-Specific Embodiments-

Hereafter, specific embodiments will be described grounded on the above-described essential features of the present invention.

-First Embodiment-

A first embodiment is described first. This embodiment discloses a technique of quantitatively evaluating local flare using a test photomask with test patterns.

Figure 3:
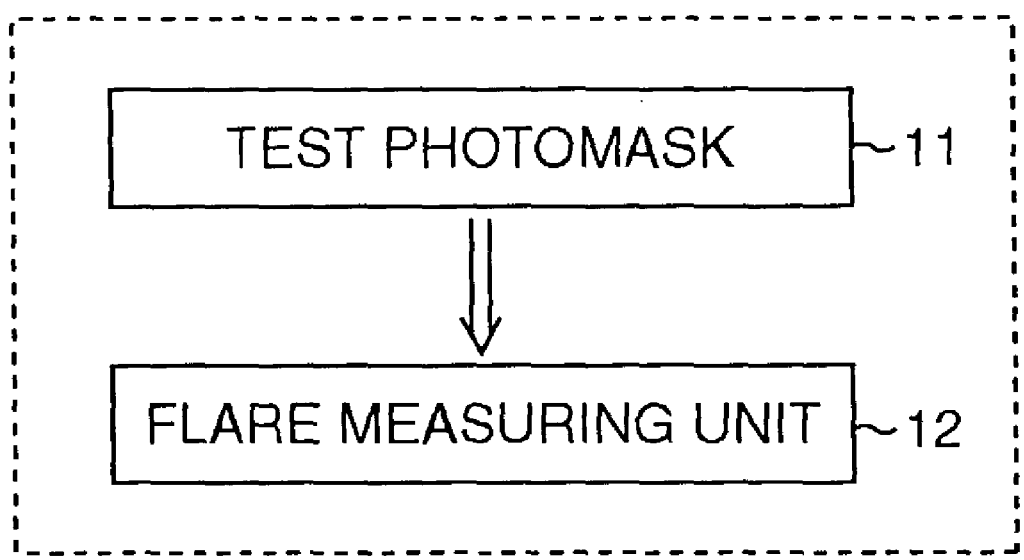
FIG. 3 is a block diagram showing the general configuration of a flare evaluating apparatus according to a first embodiment.

FIG. 3 is a block diagram showing the general configuration of a flare evaluating apparatus according to the first embodiment.

This flare evaluating apparatus comprises a test photomask 11 having test patterns for measuring flare in an aligner which is used in manufacturing semiconductor devices, and a flare measuring unit 12 which quantifies local flare based on an exposed test pattern.

FIGS. 4A to 4D are schematic diagrams showing the general configuration of the test photomask 11.

The test photomask 11 has test patterns A to C, . . . , D, and each of the test patterns has a basic configuration in which a line pattern 1 and a zone pattern 2 forming a light transmission region in a zonal shape surrounding the line pattern 1 are combined as in FIG. 1.

Figure 4A:
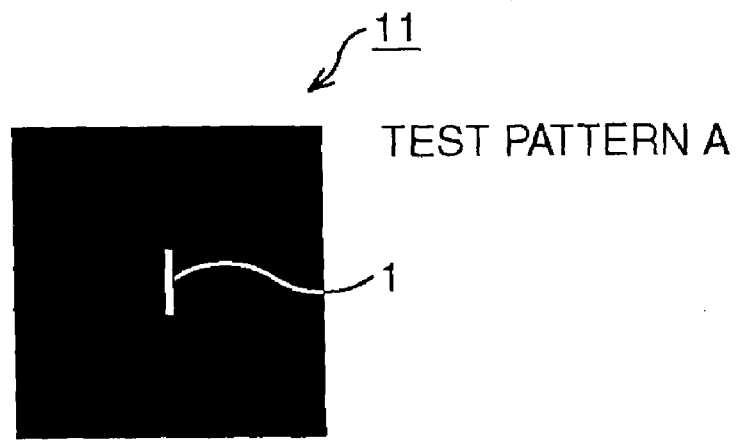
FIGS. 4A to 4D are schematic diagrams showing the general configuration of a test photomask according to the first embodiment.
Figure 4B:
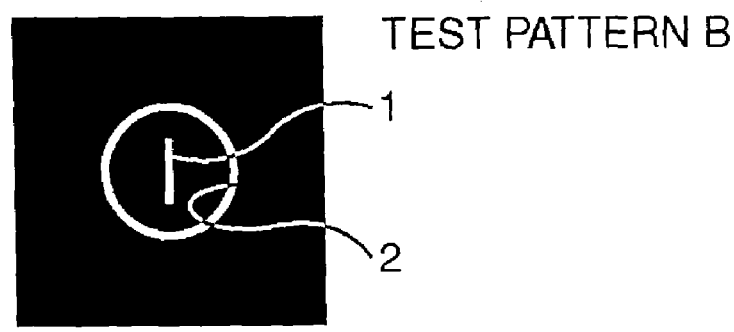
Figure 4C:
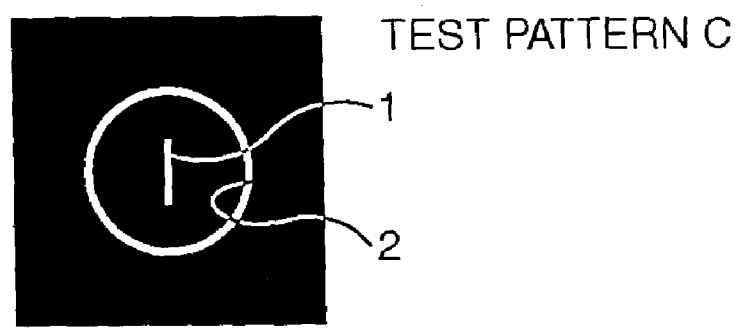
Figure 4D:
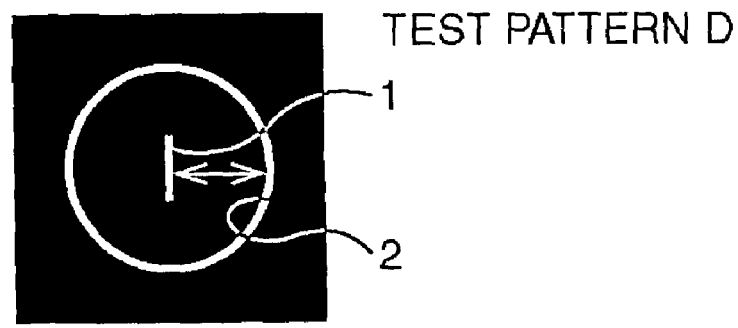

In this case, the test pattern A in FIG. 4A is constituted only by a line pattern 1 unaffected by flare, so that light is completely blocked off within a region 100 $\mu$m from the line pattern 1. The test pattern B in FIG. 4B comprises a line pattern 1 and a zone pattern 2 in which a transmission region in a zonal shape 4.14 $\mu$m in inside diameter and 6.89 $\mu$m in outside diameter is arranged to surround the line pattern 1, with no pattern other than the zone pattern 2 formed within a region of a distance from the line pattern 1 within which the effect of local flare needs to be considered. The test pattern C in FIG. 4C comprises a line pattern 1 and a zone pattern 2 in which a transmission region in a zonal shape 6.89 μm in inside diameter and 9.65 μm in outside diameter is arranged to surround the line pattern 1, with no pattern other than the zone pattern 2 formed within a region of a distance from the line pattern 1 within which the effect of local flare needs to be considered.

As described above, the zone patterns 2 are made by increasing diameters with a zone width having a fixed value of 2.76 μm in such a manner that an outside diameter of one zone pattern is taken as an inside diameter of the next zone pattern, thereby varying the inside diameter of the zone by 2.76 μm from 4.14 μm to 48.25 μm. The test pattern D in FIG. 4D having the largest diameter here is formed with a line pattern 1 and a zone pattern 2 in which a transmission region in a zonal shape 48.25 μm in inside diameter and 51.01 μm in outside diameter is arranged to surround the line pattern 1, with no pattern other than the zone pattern 2 formed within a region of a distance from the line pattern 1 within which the effect of local flare needs to be considered.

Figure 5:
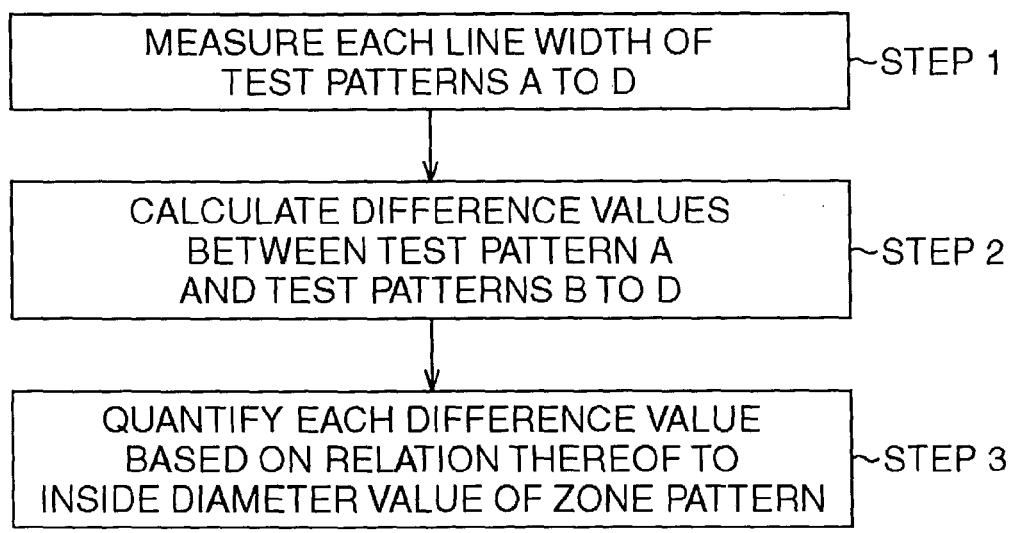
FIG. 5 is a flowchart when evaluating local flare using the flare evaluating apparatus according to the first embodiment.

FIG. 5 is a flowchart in evaluating local flare using the above flare evaluating apparatus.

First, light exposure is performed using the test patterns A to D in FIGS. 4A to 4D, a photoresist is developed, and then the line width of each of the formed line patterns 1 is measured (Step 1).

Subsequently, the measured line width of the line pattern 1 of the test pattern A is compared with the measured line width of each of the line patterns 1 of the test patterns B to D, so as to calculate each difference value in line width between the test pattern A and each of the test patterns B to D here (Step 2). The difference value is the amount of change in line width due to the local flare of each of the test patterns B to D, in which the smaller the value, the smaller the local flare to the line pattern 1, and conversely, the larger the value, the larger the local flare on the line pattern 1.

Then, the effect of the local flare of each zone pattern 2 of the test patterns B to D, that is, each of the aforementioned difference values with respect to the test pattern A is quantified based on the relation thereof to the distance from a central position of the line pattern 1 to each of the zone patterns 2, that is, an inside diameter value of each of the zone patterns 2 here (Step 3).

Figure 6:
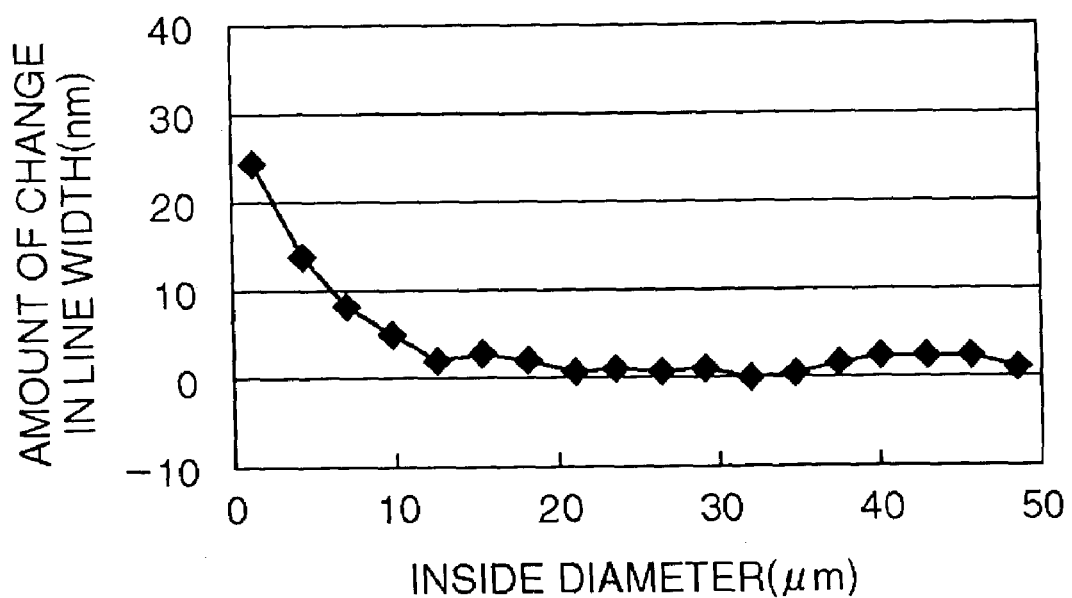
FIG. 6 is a characteristic diagram showing the results of calculating the relations between inside diameter values of zone patterns 2 and difference values and plotting them.

FIG. 6 shows the results of actually calculating the relations between the aforesaid difference values and the inside diameter values of the zone patterns 2 and plotting them.

It is found that the local flare has a great effect when the zone pattern 2 is about 12 μm or less in inside diameter, and the effect is hardly observed when the zone pattern 2 exceeds about 12 μm.

As has been described, according to the flare evaluating apparatus (method) of this embodiment, it becomes possible to quantitatively estimate the effect of local flare on the pattern which is exposed in lithography, as a change in the line width based on the relation thereof to the distance from the central position of the line pattern 1 to the zone pattern 2.

It should be noted that while the inside diameter of the zone pattern 2 is set to a range from 4.14 μm to 48.25 μm in this embodiment, an optimal range may be selected appropriately for an aligner because aligners have different ranges affected by flare.

In addition, while the zone width is set to 2.76 μm in this embodiment, a decreased width makes it possible to quantify much more finely the local flare effect corresponding to the aforementioned distance.

Furthermore, while the zone pattern 2 is formed in a circular shape in this embodiment, it may be preferably formed in a polygonal pattern considering ease of formation of the flare causing pattern.

MODIFIED EXAMPLES

Now, various modified examples of the first embodiment will be described. These examples disclose techniques of quantitatively evaluating local flare as in the first embodiment, but are different therefrom in the test photomask. Note that components and so on corresponding to those in the first embodiment are designated the same reference numerals, and description thereof is omitted.

Modified Example 1

FIGS. 7A to 7D are schematic diagrams showing the general configuration of a test photomask which is a component of a flare evaluating apparatus according to the modified example 1 of the first embodiment.

A test photomask 21 is constituted by, as shown in FIG. 7A, a pair of photomasks 21a and 21b in which the photomask 21a is formed with a line pattern group 22, and the photomask 21b is formed with a zone pattern group 23 respectively.

In the line pattern group 22, as shown in FIG. 7B, only a plurality of line patterns 1 are formed apart from each other to such an extent as not to be affected by local flare. In the zone pattern group 23, as shown in FIG. 7C, only a portion formed with no pattern (shown at the uppermost position) and zone patterns 2 which are sequentially increased in inside diameter and outside diameter, are formed adjacent to each other. The relation in size between the zone patterns 2 is similar to that in FIGS. 4A to 4D. The line pattern group 22 and the zone pattern group 23 here are arranged such that the line patterns 1 correspond to the zone patterns 2 respectively.

In this example, the photomask 21a and the photomask 21b are double-exposed to combine each of the line patterns 1 of the line pattern group 22 with each of the zone patterns 2 of the zone pattern group 23 to form test patterns shown in FIG. 7D (corresponding to FIGS. 4A to 4D).

Then, similarly to the first embodiment, the line width of each of the line patterns 1 formed by development is measured, and the measurement value of the line pattern 1 when only the line pattern 1 is formed (shown at the uppermost position in FIG. 7D) is compared with the measurement value of each of the other line patterns 1 to calculate the difference value between them here. The effect of local flare is evaluated as the difference value, thereby quantifying the effect of local flare based on the relation thereof to the distance from a central position of the line pattern 1 to each of the zone patterns 2, that is, an inside diameter value of each of the zone patterns 2.

Here, exposure can also be carried out with the exposure amount of the photomask 21b increased by several times that of the photomask 21a, followed by increasing the effect of the local flare by several times for measurement of the line width of each of the line patterns 1. This enables the amount of change in the line width to be increased by several times in the case of a small amount of change caused by the local flare, thus allowing the local flare to be quantified with higher accuracy.

In addition, while the case in which the double exposure of the photomasks 21a and 21b is carried out is shown in this example, any pattern may be employed as the pattern under measurement of the photomask 21*a*. The photomask 21*b* is double-exposed on a real device pattern, thereby enabling quantification of the effect of the local flare on the real device pattern.

Modified Example 2

FIGS. 8A to 8D are schematic diagrams showing the general configuration of a test photomask which is a component of a flare evaluating apparatus according to a modified example 2 of the first embodiment.

Figure 8D:
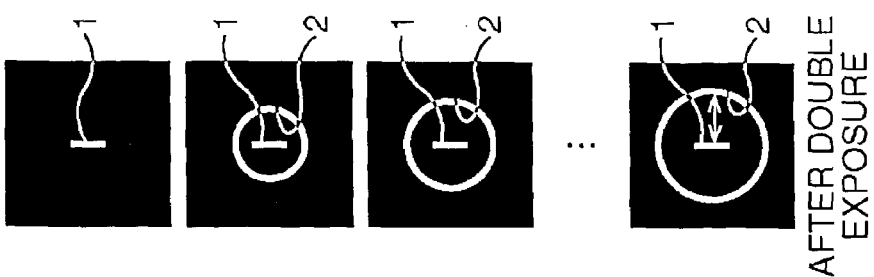
FIGS. 8A to 8D are schematic diagrams showing the general configuration of a test photomask which is a component of a flare evaluating apparatus according to a modified example 2 of the first embodiment.
Figure 8C:
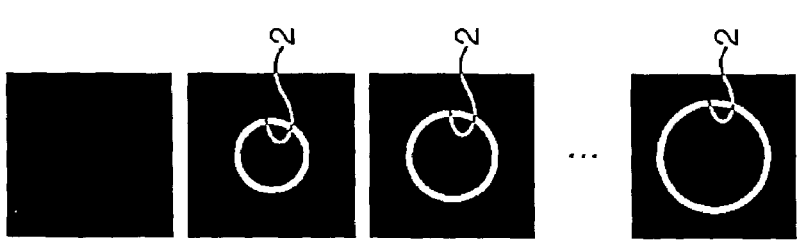
Figure 8B:
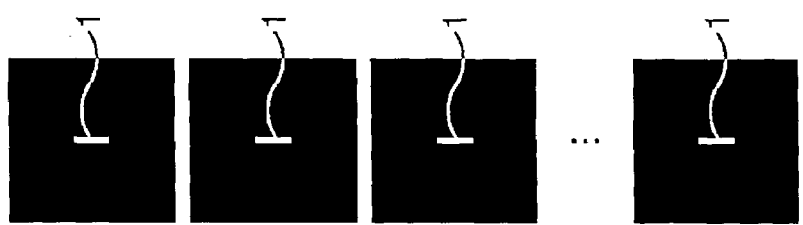
Figure 8A:
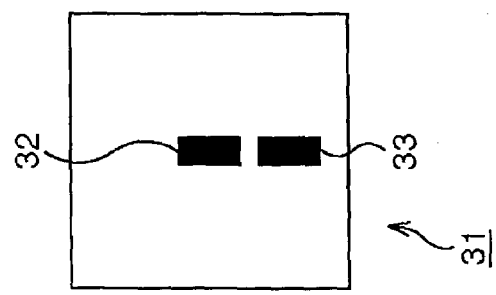

A test photomask 31 is constituted, as shown in FIG. 8A, by one photomask in which a line pattern group 32 and a zone pattern group 33 are formed apart enough from each other to such an extent as not to be affected in exposure. In the line pattern group 32, as shown in FIG. 8B, only a plurality of line patterns 1 are provided apart from each other to such an extent as not to be affected by local flare. In the zone pattern group 33, as shown in FIG. 8C, only a portion formed with no pattern (shown at the uppermost position) and zone patterns 2 which are sequentially increased in inside diameter and outside diameter, are provided apart from each other to such an extent as not to be affected by local flare. The relation in size between the zone patterns 2 is similar to that in FIGS. 4A to 4D. The line pattern group 32 and the zone pattern group 33 here are arranged such that the line patterns 1 correspond to the zone patterns 2 respectively.

In this example, using the photomask 31, each of the line patterns 1 of the line patter group 32 and each of the zone patterns 2 of the zone pattern group 33 are double-exposed and combined to form test patterns shown in FIG. 8D (corresponding to FIGS. 4A to 4D)

Then, similarly to the first embodiment, the line width of each of the line patterns 1 formed by development is measured, and the measurement value of the line pattern 1 when only the line pattern 1 is formed (shown at the uppermost position in FIG. 8D) is compared with the measurement value of each of the other line patterns 1 to calculate the difference value between them here. The effect of local flare is evaluated as the difference value, thereby quantifying the effect based on the relation thereof to the distance from a central position of the line pattern 1 to each of the zone patterns 2, that is, an inside diameter value of each of the zone patterns 2.

Here, exposure can also be carried out with the exposure amount of the zone pattern group 33 increased by several times that of the line pattern group 32, followed by increasing the effect of the local flare by several times for measurement of the line width of each of the line patterns 1. This enables the amount of change to be increased by several times in the case of a small amount of change in the line width caused by the local flare, thus allowing the local flare to be quantified with higher accuracy.

Modified Example 3

Figure 9:
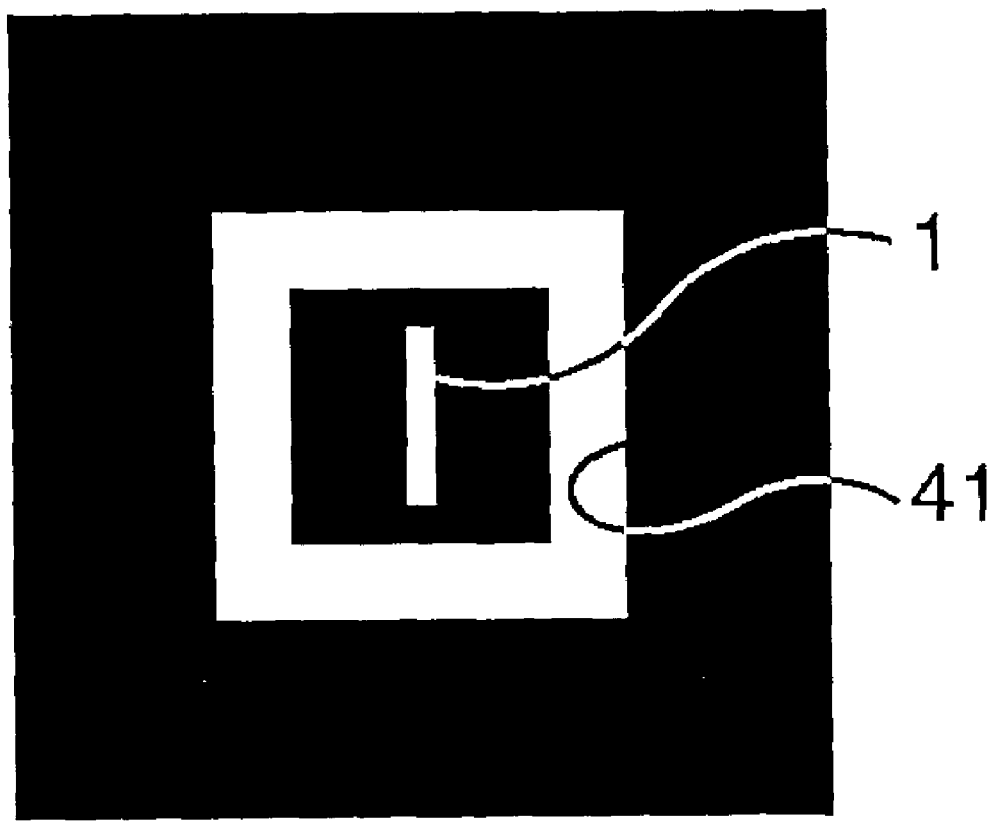
FIG. 9 is a schematic diagram showing the general configuration of a test pattern of a test photomask which is a component of a flare evaluating apparatus according to a modified example 3 of the first embodiment.
Figure 12D:
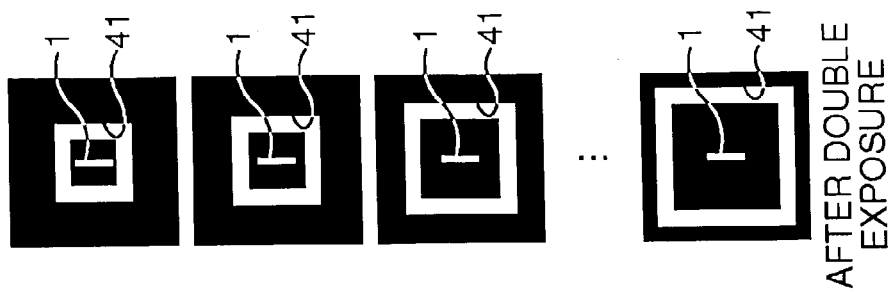
FIGS. 12A to 12D are schematic diagrams showing another general configuration of the test patterns of the test photomask which is a component of the flare evaluating apparatus according to the modified example 3 of the first embodiment.
Figure 12C:
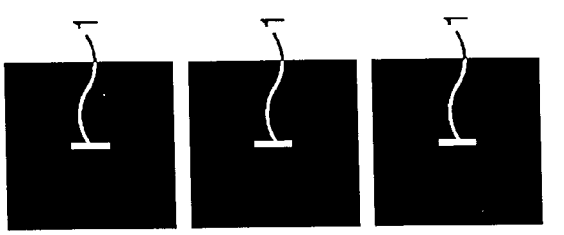
Figure 12B:
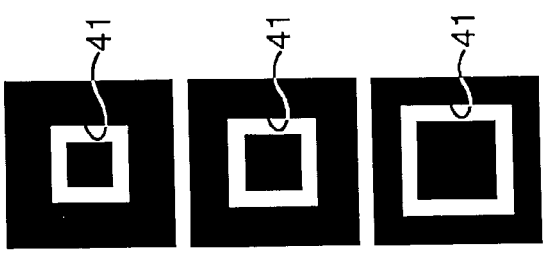
Figure 12A:
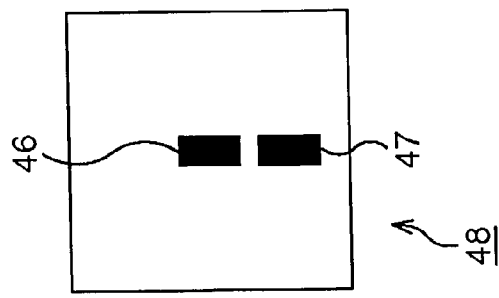

FIG. 9 is a schematic diagram showing the general configuration of a test pattern of a test photomask which is a component of a flare evaluating apparatus according to a modified example 3 of the first embodiment.

This test pattern is constituted by a line pattern 1 which becomes a pattern under measurement and a rectangular frame-shaped pattern 41 which becomes a flare causing pattern forming a light transmission region which surrounds four sides of the line pattern 1 and causes local flare to occur on the line pattern 1. The rectangular frame-shaped pattern as described above has an advantage that it is formed more easily than the zone pattern or the polygonal pattern.

In this example, it is also adoptable to use a test photomask 42 having test patterns which are constituted by, similarly to the first embodiment, identical line patterns 1 and a plurality of the rectangular frame-shaped patterns 41, which are sequentially increased in inside width and outside width with respect to the line patterns 1 respectively and have a fixed frame width, as shown in FIG. 10. In this case, similarly to the first embodiment, the effect of local flare is quantified as the aforementioned difference value, based on the relation thereof to the distance from a central position of the line pattern 1 to each of the rectangular frame-shaped patterns 41, that is, an inside width value of each of the rectangular frame-shaped patterns 41.

Further, in this example, it is also adoptable to use a test photomask 43 constituted by, similarly to the modified example 1: a photomask 43*a* having a line pattern group 44 in which only a plurality of line patterns 1 are formed; and a photomask 43*b* having a rectangular frame-shaped pattern group 45 in which only a plurality of rectangular frame-shaped patterns 41 (note that no pattern is formed at the uppermost position), which are sequentially increased in inside width and outside width, are formed apart from each other to such an extent as not to be affected by local flare, as shown in FIG. 11. In this case, similarly to the modified example 1, the photomask 43*a* and the photomask 43*b* are double-exposed to quantify the effect of local flare as the aforementioned difference value, based on the relation thereof to the distance from a central position of the line pattern 1 to each of the rectangular frame-shaped patterns 41, that is, an inside width value of each of the rectangular frame-shaped patterns 41.

Furthermore, in this example, it is also adoptable to use a test photomask 48 constituted by, similarly to the modified example 2: a line pattern group 46 in which only a plurality of line patterns 1 are formed; and a rectangular frame-shaped pattern group 47 in which only a plurality of rectangular frame-shaped patterns 41 (note that no pattern is formed at the uppermost position) which are sequentially increased in inside width and outside width, are formed adjacent to each other, such that the groups are formed apart enough from each other to such an extent as not to be affected in exposure, as shown in FIG. 12. In this case, similarly to the modified example 2, the line pattern group 46 and the rectangular frame-shaped pattern group 47 are double-exposed to quantify the effect of local flare as the aforementioned difference value, based on the relation thereof to the distance from a central position of the line pattern 1 to each of the rectangular frame-shaped patterns 41, that is, an inside width value of each of the rectangular frame-shaped patterns 41.

Modified Example 4

Figure 13:
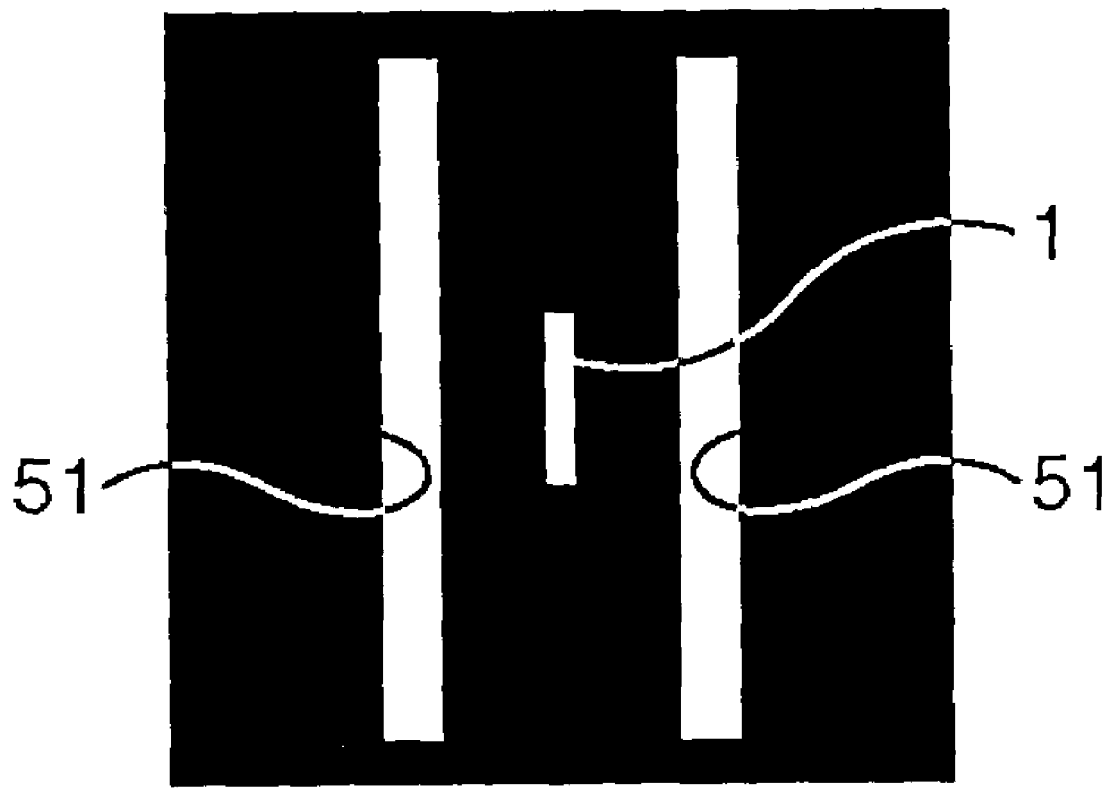
FIG. 13 is a schematic diagram showing the general configuration of a test pattern of a test photomask which is a component of a flare evaluating apparatus according to a modified example 4 of the first embodiment.

FIG. 13 is a schematic diagram showing the general configuration of a test pattern of a test photomask which is a component of a flare evaluating apparatus according to a modified example 4 of the first embodiment.

This test pattern is constituted by a line pattern 1 which becomes a pattern under measurement and a pair of linear patterns 51 which becomes a flare causing pattern forming light transmission regions which have the line pattern 1 intervening therebetween to be parallel thereto and causes local flare to occur on the line pattern 1. Such linear patterns have an advantage that they are formed more easily than the zone pattern or the polygonal pattern.

In this example, it is also adoptable to use a test photomask 52 having test patterns which are constituted by, similarly to the first embodiment, identical line patterns 1 and a plurality of the linear patterns 51, which are sequentially increased in inside width and outside width with respect to the line patterns 1 respectively and have a fixed line width, as shown in FIG. 14. In this case, similarly to the first embodiment, the effect of the local flare is quantified as the aforementioned difference value, based on the relation thereof to the distance from a central position of the line pattern 1 to each of the linear patterns 51, that is, an inside width value of each of the linear patterns 51.

Further, in this example, it is also adoptable to use a test photomask 53 constituted by, similarly to the modified example 1: a photomask 53a having a line pattern group 54 in which only a plurality of line patterns 1 are formed; and a photomask 53b having a linear pattern group 55 in which only a plurality of linear patterns 51 (note that no pattern is formed at the uppermost position), which are sequentially increased in inside width and outside width, are formed apart from each other to such an extent as not to be affected by local flare, as shown in FIG. 15. In this case, similarly to the modified example 1, the photomask 53a and the photomask 53b are double-exposed to quantify the effect of the local flare as the aforementioned difference value, based on the relation thereof to the distance from a central position of the line pattern 1 to each of the linear patterns 51, that is, an inside width value of each of the linear patterns 51.

Furthermore, in this example, it is also adoptable to use a test photomask 58 constituted by, similarly to the modified example 2: a line pattern group 56 in which only a plurality of line patterns 1 are formed; and a linear pattern group 57 in which only a plurality of linear patterns 51 (note that no pattern is formed at the uppermost position) which are sequentially increased in inside width and outside width, are formed apart from each other to such an extent as not to be affected by local flare, such that the groups are formed apart enough from each other to such an extent as not to be affected in exposure, as shown in FIG. 16. In this case, similarly to the modified example 2, the line pattern group 56 and the linear pattern group 57 are double-exposed to quantify the effect of the local flare as the aforementioned difference value, based on the relation thereof to the distance from a central position of the line pattern 1 to each of the linear patterns 51, that is, an inside width value of each of the linear patterns 51.

Modified Example 5

Figure 17:
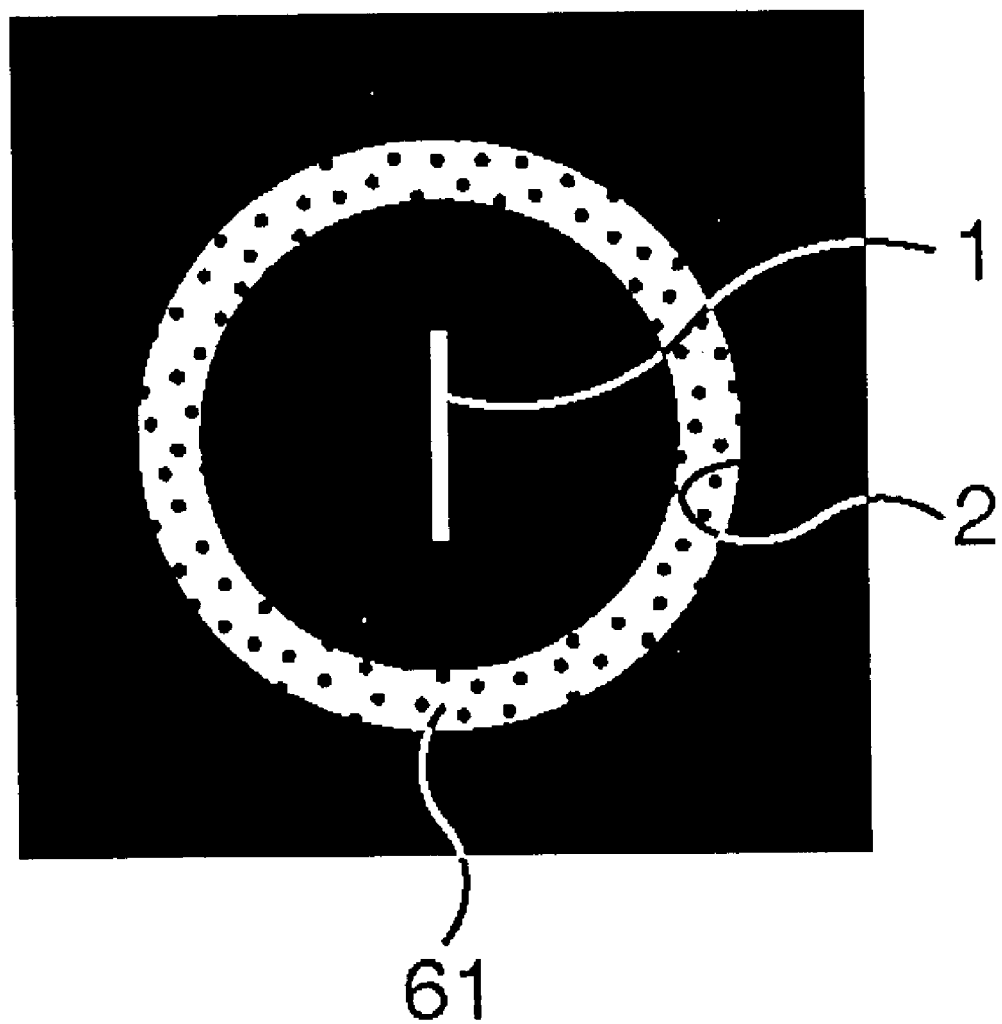
FIG. 17 is a schematic diagram showing the general configuration of a test pattern of a test photomask which is a component of a flare evaluating apparatus according to a modified example 5 of the first embodiment.

FIG. 17 is a schematic diagram showing the general configuration of a test pattern of a test photomask which is a component of a flare evaluating apparatus according to a modified example 5 of the first embodiment.

This test pattern has, similarly to the first embodiment, a line pattern 1 and a zone pattern 2, in which a plurality of dummy patterns 61 are provided in a light transmission region of the zone pattern 2 to control the opening area ratio of the light transmission region of the zone pattern 2. The dummy patterns 61 may be formed here finely to such an extent that no pattern is formed by exposure.

While the test pattern of the first embodiment is shown, as an example, in FIG. 17, it is also preferable to form the dummy patterns 61 here in each of the flare causing patterns in the test patterns of the modified examples 1 to 4 to control the opening area ratio thereof.

Figure 18:
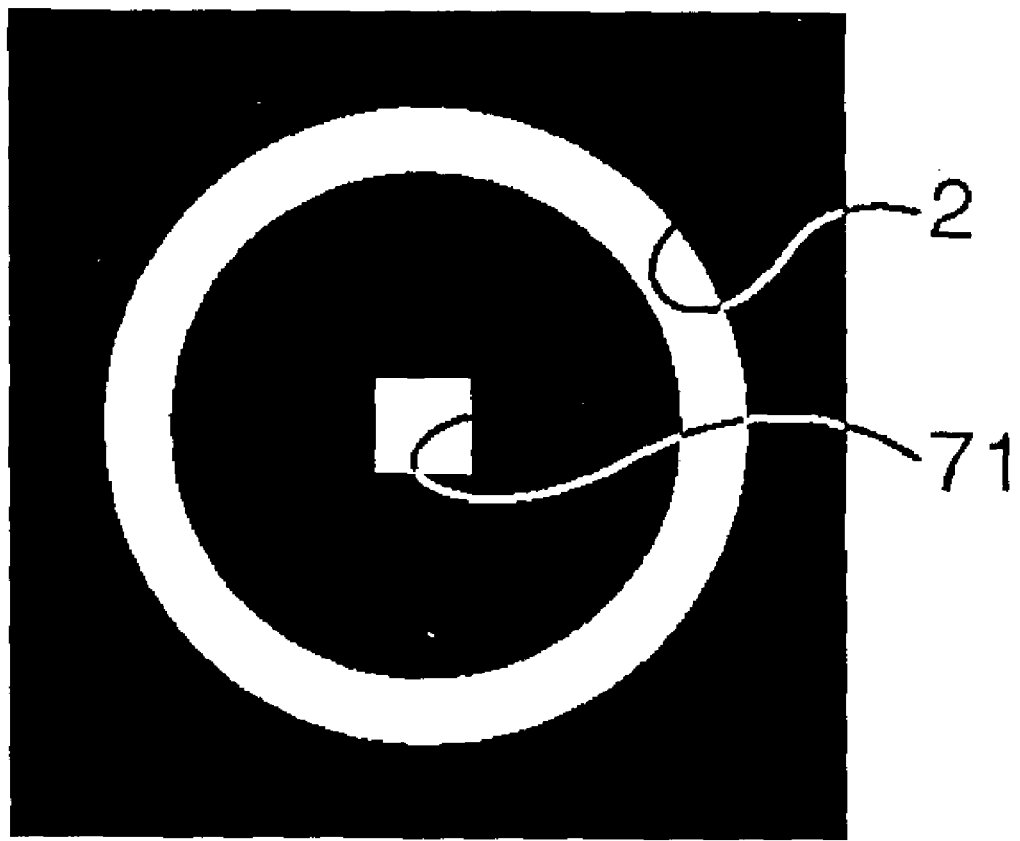
FIG. 18 is a schematic diagram showing a test pattern formed with a contact hole pattern as a pattern under measurement in the first embodiment.

It should be noted that the line pattern 1 which is a pattern having an isolated line punched therein is shown as an example, as the pattern under measurement, in the above-described first embodiment and its modified examples. However, not limited to the above pattern, but, for example, a line-and-space pattern, a contact hole pattern, and so on can also be applied in the present invention. Specifically, a test pattern in which a contact hole pattern 71 is formed as the pattern under measurement in the first embodiment, is shown in FIG. 18.

-Second Embodiment-

Next, a second embodiment will be described. This embodiment discloses a technique of compensating the effect of local flare using the flare evaluating apparatus (method) which has been described in the first embodiment. Note that, in the explanation hereinafter, while the explanation will be given taking, as an example, the test photomask 11 which has been described as the photomask of the flare evaluating apparatus in the first embodiment, it is also preferable to use the test photomasks disclosed in the modified examples 1 to 4.

Figure 19:
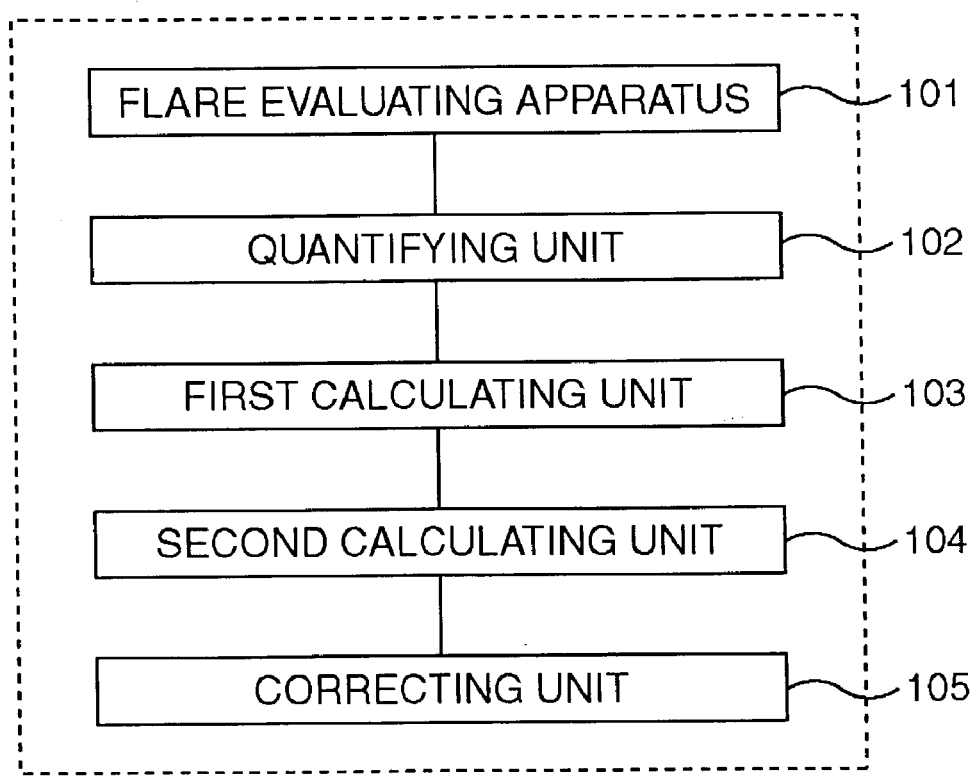
FIG. 19 is a block diagram showing the general configuration of a flare compensating apparatus according to a second embodiment.

FIG. 19 is a block diagram showing the general configuration of a flare compensating apparatus according to the second embodiment.

This flare compensating apparatus comprises a flare evaluating apparatus 101 which has been disclosed in the first embodiment; a quantifying unit 102 indicating a change in measurement value of the line width of a line pattern 1 by the relation between the distance from the line pattern 1 to a zone pattern 2 and the opening area of a light transmission region of the zone pattern 2, for example, by a function or table; a first calculating unit 103 for calculating, in a target real pattern, the opening area within a fixed distance from the real pattern for every fixed region; a second calculating unit 104 for inputting the distance from the real pattern to the opening and the calculated area of the opening into the aforementioned relation (function or table) to calculate the line width of the real pattern; and a correcting unit 105 for correcting design data of the real pattern based on the calculated line width of the real pattern.

Figure 20:
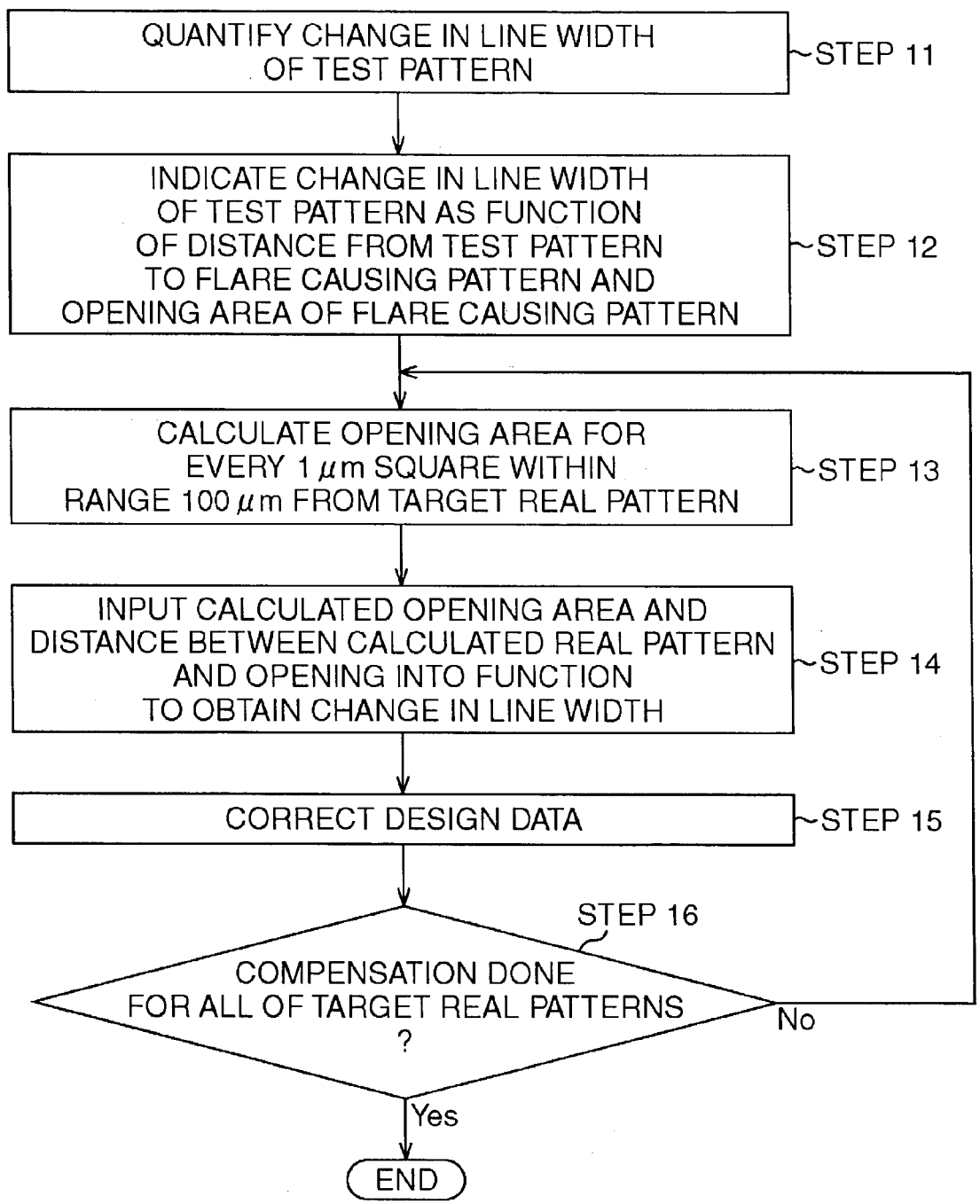
FIG. 20 is a flowchart of compensating the effect of local flare on a real pattern in fabricating a semiconductor device using the flare compensating apparatus.

FIG. 20 is a flowchart of compensating the effect of local flare on a real pattern in fabricating a semiconductor device using the flare compensating apparatus.

First, the effect of the local flare on the line pattern 1 is quantified as the aforementioned difference value based on the relation thereof to the distance from a central position of the line pattern 1 to each of the zone patterns 2, that is, an inside diameter value of each of the zone patterns 2 by conducting Steps 1 to 3 in FIG. 5 which have been explained in the first embodiment (Step 11).

Subsequently, a function or table is created which indicates the change in the line width of the measured line pattern 1, that is, the relation between the distance from the line pattern 1 to the zone pattern 2 and the opening area of the light transmission region of the zone pattern 2 (Step 12).

Subsequently, in an actually formed device pattern (real pattern), in a target real pattern the opening area within a fixed distance from the real pattern is calculated for every fixed region, for example, the opening area being calculated here for every 1 $\mu$m square within a range of a distance from the real pattern within which the effect of the local flare needs to be considered, for example, 100 $\mu$m (Step 13).

Subsequently, the calculated opening area and the distance from the real pattern to the calculated opening region are inputted into the function or table to obtain the change in the line width of the real pattern (Step 14).

Subsequently, the design data of the real pattern is corrected based on the calculated line width of the real pattern to bring the line width as close as possible to the measured line width when only the real pattern has been measured as the object under measurement (Step 15).

Then, Steps 13 to 15 are executed in sequence on a plurality of real patterns of the photomask using the function or table obtained in Step 12 to compensate the effect of the local flare on each of the real patterns of the photomask (Step 16).

As has been described, according to the flare compensating apparatus (method) of this embodiment, it becomes possible to compensate the local flare occurring on the real patterns in a semiconductor device, using the line width of the pattern under measurement estimated by the flare evaluating apparatus, thereby forming an intended pattern easily and accurately.

Figure 21:
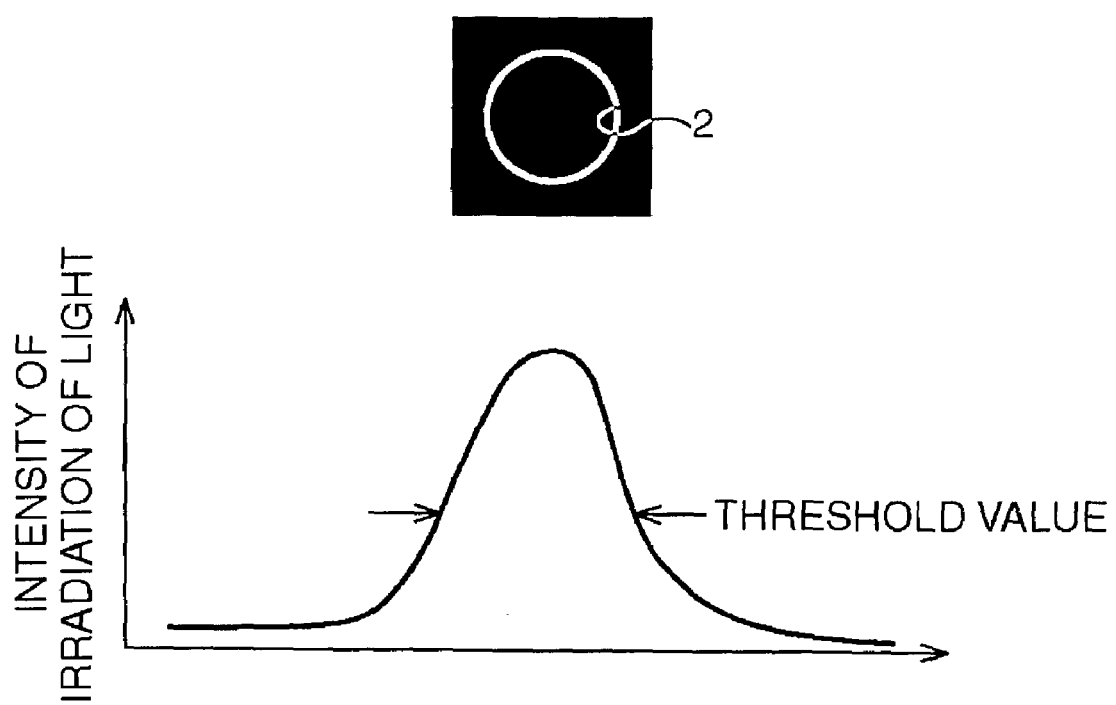
FIG. 21 is a characteristic diagram when, as a measurement value of a pattern under measurement, the intensity of irradiation of exposure light on the pattern under measurement is used in place of the line width.

It should be noted that while the case of evaluating the effect of the local flare as the change in the line width of the pattern under measurement is shown as an example in the first and second embodiments, but the present invention is not limited to this, and it is also adoptable to use, as the measurement value of the pattern under measurement, for example, the intensity of irradiation of exposure light on the pattern under measurement in place of the line width. In this case, projection exposure is executed using a test pattern having only the zone pattern 2 with no line pattern under measurement as shown in FIG. 21, and the intensity of light at the central position of the transferred zone pattern 2 is measured by an illuminometer (an exposure threshold value being shown by an arrow). The amount of change in the line width by irradiation of exposure light with measured energy onto the test pattern is previously obtained in an experiment by irradiating light onto the pattern under measurement which has been previously formed by a proper exposure amount. Alternatively, the amount of change may be obtained by a light intensity simulation. The evaluation of the local flare by the illuminometer has an advantage that it can be conducted in a time shorter than by the measurement of the line width.

Each of the devices and units constituting the flare evaluating apparatus and flare compensating apparatus and the steps of the flare evaluation method and flare compensation method (Steps 1 to 3 in FIG. 5 and Steps 11 to 16 in FIG. 20) according to the above-described embodiments and modified examples, can be implemented by the operation of a program stored in RAM or ROM in a computer. The program and a computer-readable storage medium storing therein the program are included in the present invention.

Specifically, to the computer, the program is provided, stored in a storage medium such as, for example, CD-ROM or via various kinds of transmission media. In addition to the CD-ROM, a-flexible disc, a hard disc, a magnet tape, a magnet-optical disc, a nonvolatile memory card, and so on can be used as the storage medium storing therein the aforementioned program. As the transmission medium of the program, it is possible to use a communication medium (a wired channel such as an optical fiber, a wireless channel, or the like) in a computer network (LAN, WAN such as Internet, a wireless communication network, or the like) system for supplying program information by propagating it as a carrier wave.

Further, the computer executes the supplied program to thereby implement the functions of the above-described embodiments. In addition, the present invention also includes programs in the cases: where the program cooperates with an OS (operating system), other application software, and so on operating in the computer to implement the functions of the above-described embodiments; and where the supplied program is processed fully or partially by a function expansion board or a function expansion unit of the computer to implement the functions of the above-described embodiments.

Figure 22:
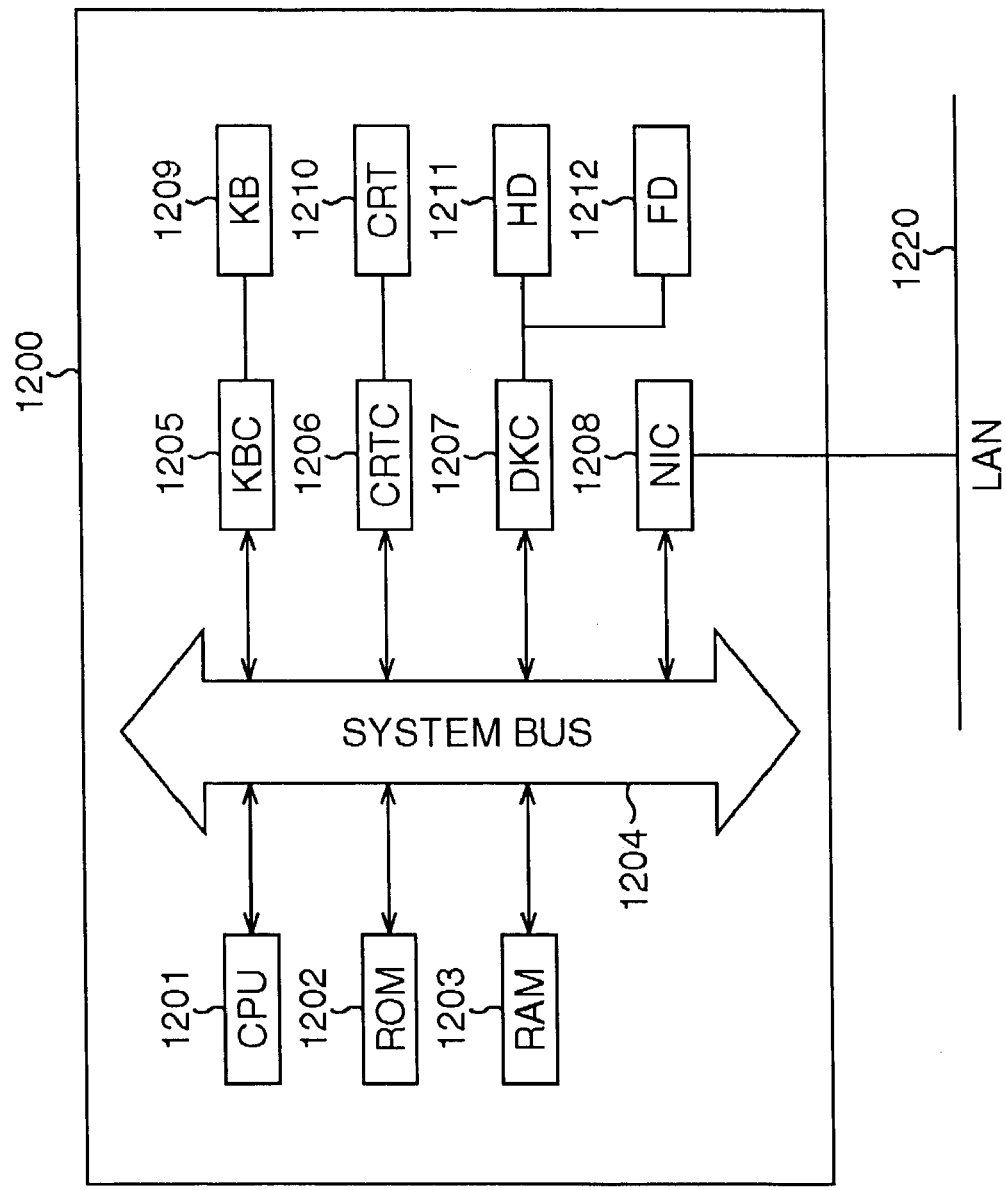
FIG. 22 is a schematic diagram showing the internal configuration of a typical personal user's terminal unit.

For example, FIG. 22 is a schematic diagram showing the internal configuration of a typical personal user's terminal unit. In FIG. 22, numeral 1200 denotes a computer PC. The PC 1200 comprises a CPU 1201 to execute device control software which is stored in a ROM 1202 or a hard disc (HD) 1211 or supplied from a flexible disc drive (FD) 1212, thereby comprehensively controlling devices connected to a system bus 1204.

According to the present invention, it is possible to quantitatively estimate the effect of local flare on a pattern which is exposed in lithography. Further, it becomes possible to compensate local flare occurring on real patterns in a semiconductor device using the estimated measurement value, thereby forming an intended pattern easily and accurately.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A flare evaluation method for measuring flare in an aligner which is used when a semiconductor device is manufactured, comprising the step of:
through use of a test mask unit having a pattern under measurement which becomes an object of estimating said flare thereon, and a plurality of flare causing patterns forming light transmission regions for causing local flare to occur on said pattern under measurement and having different distances from said pattern under measurement,
quantifying an effect of said flare on said pattern under measurement for each of said flare causing patterns as each measurement value of said pattern under measurement, based on a relation thereof to said distance.

2. The flare evaluation method according to claim 1, wherein
a line width of said pattern under measurement is measured as said measurement value.

3. The flare evaluation method according to claim 2, wherein
an intensity of light irradiated onto said flare causing pattern is measured as said measurement value.

4. The flare evaluation method according to claim 1, wherein
said test mask unit comprises a first photomask formed with said pattern under measurement and a second photomask formed with each of said flare causing patterns, and
said pattern under measurement and each of said flare causing patterns are combined by multi-exposure.

5. The flare evaluation method according to claim 1, wherein
said test mask unit comprises said pattern under measurement and each of said flare causing patterns formed at positions apart enough from each other in the same photomask, and
said pattern under measurement and each of said flare causing patterns are combined by multi-exposure.

6. The flare evaluation method according to claim 1, wherein each of said flare causing patterns is a circular light transmission region and is arranged to surround said pattern under measurement.

7. The flare evaluation method according to claim 1, wherein
each of said flare causing patterns is a rectangular frame-shaped light transmission region and is arranged to surround said pattern under measurement.

8. The flare evaluation method according to claim 1, wherein
each of said flare causing patterns comprises at least two linear light transmission regions and are arranged to have said pattern under measurement intervening therebetween.

9. The flare evaluation method according to claim 1, wherein
each of said flare causing patterns has a plurality of fine light block patterns in said light transmission region, and
said fine light block patterns control an opening area ratio of said light transmission region.

10. A flare compensation method, comprising:
a first step of, through use of a test mask unit having a pattern under measurement which becomes an object of estimating flare occurring in an aligner which is used when a semiconductor device is manufactured, and a plurality of flare causing patterns forming light transmission regions for causing local flare to occur on said pattern under measurement and having different distances from said pattern under measurement, quantifying an effect of said flare on said pattern under measurement for each of said flare causing patterns, based on a relation between each measurement value of said pattern under measurement and said distance;
a second step of quantifying a change in said measurement value of said pattern under measurement, based on a relation between said distance and an opening area of said light transmission region of said flare causing pattern;
a third step of calculating, in a target real pattern, an area of an opening within a fixed distance from said real pattern for every fixed region;
a fourth step of inputting a distance from said real pattern to said opening and said calculated opening area into said relation to calculate said measurement value of said real pattern; and
a fifth step of correcting design data of said real pattern based on said calculated measurement value.

11. The flare compensation method according to claim 10, wherein
a line width of said pattern under measurement is measured as said measurement value.

12. The flare compensation method according to claim 10, wherein
an intensity of light irradiated onto said pattern under measurement is measured as said measurement value.

13. The flare compensation method according to claim 10, wherein
said test mask unit comprises a first photomask formed with said pattern under measurement and a second photomask formed with each of said flare causing patterns, and
said pattern under measurement and each of said flare causing patterns are combined by multi-exposure.

14. The flare compensation method according to claim 10, wherein
said test mask unit comprises said pattern under measurement and each of said flare causing patterns formed at positions apart enough from each other in the same photomask, and
said pattern under measurement and each of said flare causing patterns are combined by multi-exposure.

15. The flare compensation method according to claim 10, wherein
each of said flare causing patterns is a circular light transmission region and is arranged to surround said pattern under measurement.

16. The flare compensation method according to claim 10, wherein
each of said flare causing patterns is a rectangular frame-shaped light transmission region and is arranged to surround said pattern under measurement.

17. The flare compensation method according to claim 10, wherein
each of said flare causing patterns comprises at least two linear light transmission regions and are arranged to have said pattern under measurement intervening therebetween.

18. The flare compensation method according to claim 10, wherein
each of said flare causing patterns has a plurality of fine light block patterns in said light transmission region, and
said fine light block patterns control an opening area ratio of said light transmission region.

19. The flare compensation method according to claim 10, wherein
said third to fifth steps are repeatedly performed for every real pattern to be formed.

20. A test photomask for use in measuring flare in an aligner which is used when a semiconductor device is manufactured, comprising:
a pattern under measurement which becomes an object of estimating said flare thereon; and
a plurality of flare causing patterns forming light transmission regions for causing local flare to occur on said pattern under measurement and having different distances from said pattern under measurement;
a first photomask formed with said pattern under measurement; and
a second photomask formed with each of said flare causing patterns,
wherein said pattern under measurement and each of said flare causing patterns are combined by multi-exposure.

21. A test photomask for use in measuring flare in an aligner which is used when a semiconductor device is manufactured, comprising:
a pattern under measurement which becomes an object of estimating said flare thereon; and
a plurality of flare causing patterns forming light transmission regions for causing local flare to occur on said pattern under measurement and having different distances from said pattern under measurement;
wherein said pattern under measurement and each of said flare causing patterns formed at positions apart enough from each other in the same photomask,
wherein said pattern under measurement and each of said flare causing patterns are combined by multi-exposure.

22. A test photomask for use in measuring flare in an aligner which is used when a semiconductor device is manufactured, comprising:
a pattern under measurement which becomes an object of estimating said flare thereon; and a plurality of flare causing patterns forming light transmission regions for causing local flare to occur on said pattern under measurement and having different distances from said pattern under measurement;

wherein each of said flare causing patterns is a circular light transmission region and is arranged to surround said pattern under measurement.

23. A test photomask for use in measuring flare in an aligner which is used when a semiconductor device is manufactured, comprising:

a pattern under measurement which becomes an object of estimating said flare thereon; and a plurality of flare causing patterns forming light transmission regions for causing local flare to occur on said pattern under measurement and having different distances from said pattern under measurement;

wherein each of said flare causing patterns is a rectangular frame-shaped light transmission region and is arranged to surround said pattern under measurement.

24. A test photomask for use in measuring flare in an aligner which is used when a semiconductor device is manufactured, comprising:

a pattern under measurement which becomes an object of estimating said flare thereon; and a plurality of flare causing patterns forming light transmission regions for causing local flare to occur on said pattern under measurement and having different distances from said pattern under measurement;

wherein each of said flare causing patterns comprises at least two linear light transmission regions and are arranged to have said pattern under measurement intervening therebetween.

25. A test photomask for use in measuring flare in an aligner which is used when a semiconductor device is manufactured, comprising:

a pattern under measurement which becomes an object of estimating said flare thereon; and a plurality of flare causing patterns forming light transmission regions for causing local flare to occur on said pattern under measurement and having different distances from said pattern under measurement;

wherein each of said flare causing patterns has a plurality of fine light block patterns in said light transmission region, and said fine light block patterns control an opening area ratio of said light transmission region.

* * * * *